United States Patent [19]

Hagino

[11] Patent Number: 5,699,019
[45] Date of Patent: Dec. 16, 1997

[54] ACTIVE FILTER

[75] Inventor: Hideyuki Hagino, Kumagaya, Japan

[73] Assignee: Kabushiki Kaisha Toshiba, Kawasaki, Japan

[21] Appl. No.: 663,663

[22] Filed: Jun. 14, 1996

[30] Foreign Application Priority Data

Jun. 29, 1995 [JP] Japan ................... 7-164166

[51] Int. Cl.$^6$ ................................................... H03F 3/191
[52] U.S. Cl. ........................ 330/302; 330/303; 330/306
[58] Field of Search ............................. 330/69, 107, 151, 330/252, 302, 303, 306

[56] References Cited

U.S. PATENT DOCUMENTS

| | | | |
|---|---|---|---|
| 3,969,682 | 7/1976 | Rossum | 330/107 X |
| 4,560,963 | 12/1985 | Sharpe | 330/302 X |
| 5,610,551 | 3/1997 | Hosoya | 330/303 X |

FOREIGN PATENT DOCUMENTS 2327016  11/1974  Germany .................. 330/107

OTHER PUBLICATIONS

Elektor Electronics, vol. 3, No. 5, pp. 43–45, May 1977, "Music Cleaner".

Radio and Electronic Engineer, vol. 33, No. 3, pp. 184–186, Mar. 1967, A. Woroncow, et al., "Inductorless Band–Pass I.F. Amflifiers".

*Primary Examiner*—Steven Mottola
*Attorney, Agent, or Firm*—Oblon, Spivak, McClelland, Maier & Neustadt, P.C.

[57] ABSTRACT

There is provided an active filter, having a first high-pass filter for receiving an input signal, performing filter processing of the input signal, and outputting a first signal, a second high-pass filter, an input terminal of which is connected to an output terminal of said first high-pass filter, and which receives the first signal, performs filter processing, and outputs a second signal, a differential amplifier, one input terminal of which is connected to an output terminal of said second high-pass filter to receive the second signal, the other input terminal of which is connected to the output terminal of said first high-pass filter to receive the first signal, and which outputs a third signal obtained by multiplying a difference between the first and second signals with a gain, and an adder for receiving and adding the third signal output from said differential amplifier and the input signal, and outputting a sum signal. Since the active filter can be constituted by the first and second high-pass filters, the differential amplifier, and the adder, the number of elements is reduced.

6 Claims, 3 Drawing Sheets

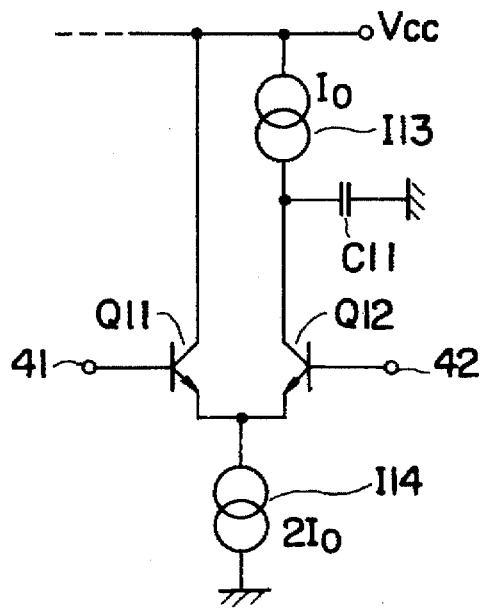
F I G. 2
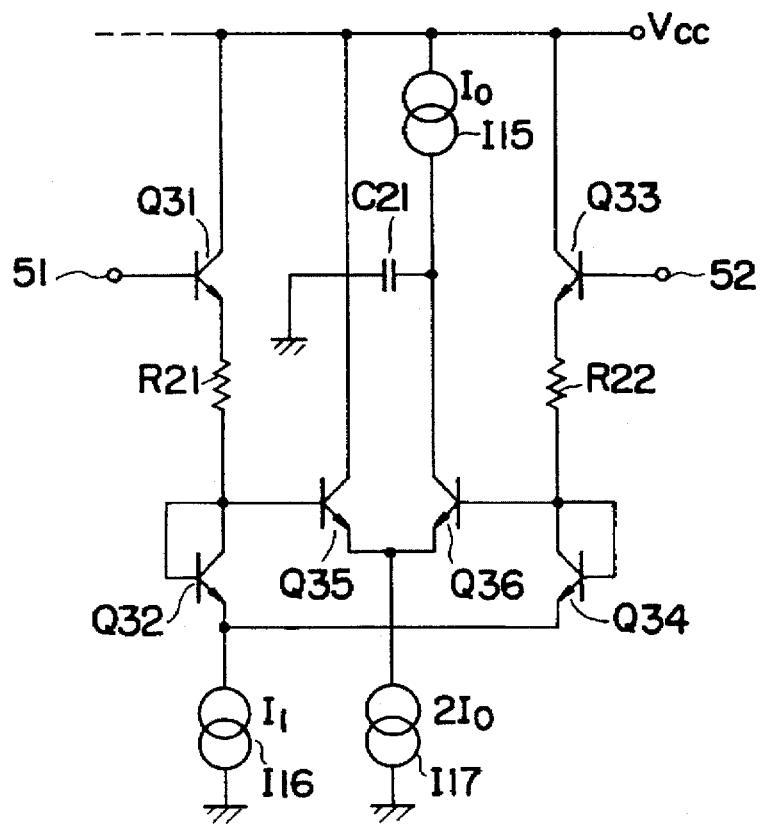
F I G. 3

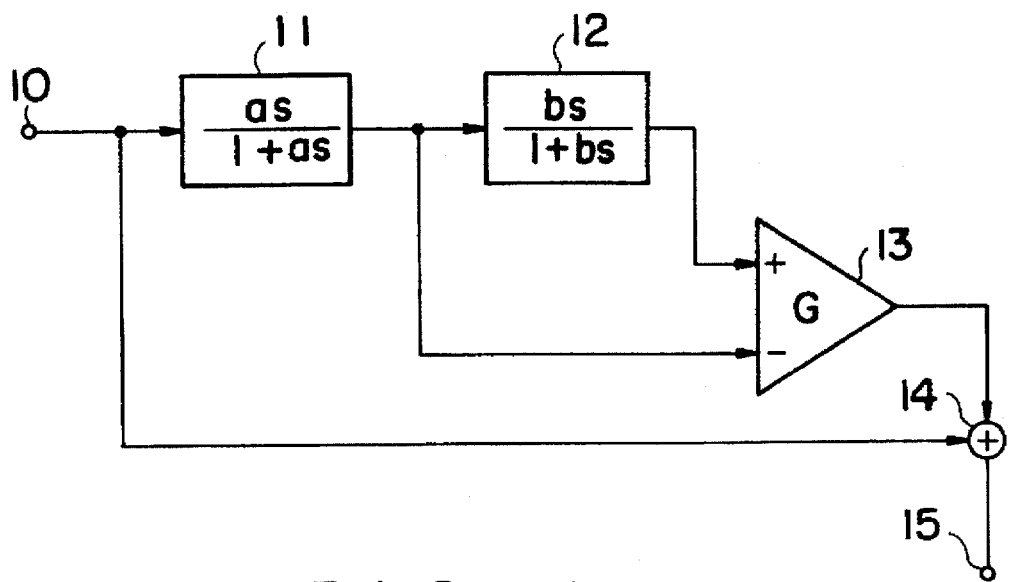
F I G. 4
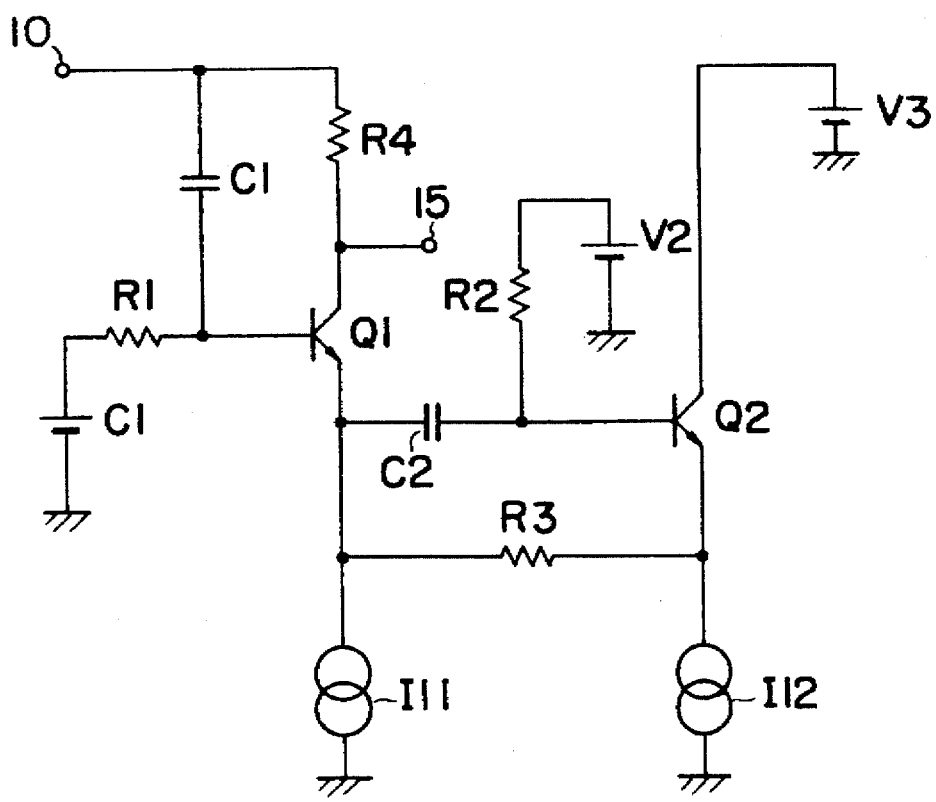
F I G. 5

ACTIVE FILTER

BACKGROUND OF THE INVENTION

The present invention relates to an active filter.

FIG. 1 shows an arrangement of an active filter related to the present invention. The non-inverting input terminal of a gm amplifier 31 is connected to an external input terminal 30, and the output terminal of the gm amplifier 31 is grounded through a capacitor C1. The output terminal of the gm amplifier 31 is also connected to the non-inverting input terminal of a gm amplifier 32, and the external input terminal 30 is connected to the inverting input terminal of the amplifier 32 via a resistor R11. The output terminal of the gm amplifier 32 is connected to the input terminal of a buffer 33, and is also connected to the external input terminal 30 via a capacitor C2. The output terminal of the buffer 33 is connected to an external output terminal 34, and is also connected to the inverting input terminal of the gm amplifier 31. Furthermore, the output terminal of the buffer 33 is connected to the inverting input terminal of the gm amplifier 32 via a resistor R12.

Let D11(s) be the transfer function at the external input terminal 30, D12(s) be the transfer function at the output terminal of the gm amplifier 31, D13(s) be the transfer function at the output terminal of the gm amplifier 32 and at the external output terminal 34, and D14(s) be the transfer function at the inverting input terminal of the gm amplifier 32. Also, let s (=j$\phi$) be the Laplace operator, a be the gain of the gm amplifier 31, and b be the gain of the gm amplifier 32. Then, the following relations hold:

$$D12(s) = \frac{a}{s} \cdot (D11(s) - D13(s)) \quad (1)$$

$$D14(s) = \frac{R12}{R11+R12} \cdot D11(s) + \frac{R11}{R11+R12} \cdot D13(s) \quad (2)$$

$$D13(s) = \frac{b}{s} \cdot (D12(s) - D13(s)) + D11(s) \quad (3)$$

$$= \frac{b}{s} \cdot \left[ \frac{a}{s} (D11(s) - D13(s)) - \frac{R12}{R11+R12} \cdot \right.$$

$$\left. D11(s) - \frac{R11}{R11+R12} \cdot D13(s) \right] + D11(s)$$

$$= \frac{ab}{s^2} \cdot D11(s) - \frac{ab}{s^2} \cdot D13(s) - \frac{R12}{R11+R12} \cdot$$

$$\frac{b}{s} \cdot D11(s) - \frac{R11}{R11+R12} \cdot \frac{b}{s} \cdot D13(s) + D11(s)$$

$$\frac{D13(s)}{D11(s)} = \frac{s^2 - \frac{R11}{R11+R12} \cdot bs + ab}{s^2 + \frac{R11}{R11+R12} \cdot bs + ab} \quad (4)$$

In this case, if R11=R12, an all-pass filter which has flat gain characteristics, and shifts the phase of an input signal and outputs the obtained signal is attained. On the other hand, if R12=0, a trap filter is attained.

As described above, the active filter is constituted using the gm amplifiers 31 and 32. The gm amplifier is realized by the arrangement shown in FIG. 2 or 3. The gm amplifier shown in FIG. 2 comprises npn transistors Q11 and Q12, a constant current source I13 for outputting a constant current I0, a constant current source I14 for outputting a constant current 2I0, and a capacitor C11. Let D21(s) and D22(s) respectively be the transfer functions of external input terminals 41 and 42 in this case, D23(s) be the transfer function of the collector terminal of a bipolar transistor Q2, which serves as the output terminal of this circuit, and re1 and re2 be the emitter resistances of the bipolar transistors Q11 and Q12. Then, the transfer function D23(s) is given by:

$$D23(s) = \frac{1}{2re1} \cdot \frac{1}{j\omega C1} \cdot (D21(s) - D22(s)) \quad (5)$$

The gm amplifier shown in FIG. 3 comprises npn transistors Q31 to Q36, a capacitor C21, resistors R21 and R22 (each having a resistance R0), and constant current sources I15 and I16. Let D31(s), D32(s), D33(s), and D34(s) respectively be the transfer functions of the transistors Q31, Q33, Q32, and Q34, and D35(s) be the transfer function at the collector terminal of the transistor Q36, which serves as the output terminal. In this case, the transfer functions D33(s), S34(s), and S35(s) are respectively given by:

$$D33(s) = \frac{R21+3re1}{2R21+4re1} \cdot D31(s) + \frac{R21+re1}{2R21+4re1} \cdot D32(s) \quad (6)$$

$$D34(s) = \frac{R21+re1}{2R21+4re1} \cdot D31(s) + \frac{R21+3re1}{2R21+4re1} \cdot D32(s) \quad (7)$$

$$D35(s) = \frac{1}{2re2} \cdot \frac{1}{j\omega C21} \cdot (D33(s) - D34(s)) \quad (8)$$

$$= \frac{1}{2re2} \cdot \frac{1}{j\omega C21} \cdot \frac{2re1}{2R21+4re1} (D31(s) - D32(s))$$

According to the gm amplifier shown in FIG. 2, voltages having DC components can be input to the external input terminals 41 and 42 connected to the bases of the bipolar transistors Q11 and Q12, and a low output impedance can be obtained. The same applies to the gm amplifier shown in FIG. 3.

However, when an active filter is constituted using gm amplifiers, many active elements are required. When the active filter shown in FIG. 1 is constituted using the gm amplifiers each including the two transistors Q11 and Q12 shown in FIG. 2, a total of four transistors are required. On the other hand, when the gm amplifiers each including the six transistors Q31 to Q36 shown in FIG. 3 are used, a total of 12 transistors are required. As described above, since an active filter using gm amplifiers requires a large number of elements, the filter becomes bulky and requires large consumption power.

When the gm amplifier shown in FIG. 3 is used, external signals are input to the bases of the transistors Q31 and Q33, and are then supplied to the collectors and bases of the transistors Q32 and Q34, thus causing a compression effect, i.e., an increase in noise components.

SUMMARY OF THE INVENTION

It is, therefore, an object of the present invention to provide an active filter which can be constituted by a smaller number of elements and can be rendered compact.

It is another object of the present invention to provide an active filter which requires small consumption power.

It is still another object of the present invention to provide an active filter which can prevent an increase in noise components.

According to the present invention, there is provided an active filter comprising a first high-pass filter for receiving an input signal, performing filter processing of the input signal, and outputting a first signal, a second high-pass filter, an input terminal of which is connected to an output terminal of the first high-pass filter, and which receives the first signal, performs filter processing, and outputs a second signal, a differential amplifier, one input terminal of which is connected to an output terminal of the second high-pass filter to receive the second signal, the other input terminal of which is connected to the output terminal of the first high-pass filter to receive the first signal, and which outputs a third signal obtained by multiplying a difference between the first and second signals with a gain, and an adder for receiving and adding the third signal output from the differential amplifier and the input signal, and outputting a sum signal.

As described above, when the active filter is constituted by the first and second high-pass filters, the differential amplifier, and the adder, the number of elements can be reduced. For example, according to an active filter described in claim 2, the active filter can be constituted using two transistors as active elements.

In this case, when a constant of the first high-pass filter is represented by a, a constant of the second high-pass filter is represented by b, and the gain of the differential amplifier is represented by G, if a+b−aG=−(a+b) holds, the active filter serves as an all-pass filter; if a+b−aG=0 holds, the active filter serves as a trap filter.

Also, according to the present invention, there is provided an An active filter comprising a first resistance, one terminal of which is connected to a first power supply voltage terminal, a first capacitor, one terminal of which is connected to the other terminal of the first resistor, and the other terminal of which is connected to an external input terminal for receiving an input terminal, a second resistor, two terminals of which are connected between the external input terminal and the external output terminal, a first transistor, a collector of which is connected to the external output terminal, a base of which is connected the one terminal of the first capacitor, and an emitter of which is connected to a first constant current source, a second capacitor, one terminal of which is connected to the emitter of the first transistor, a third resistor, two terminals of which are connected between the other terminal of the second capacitor and a second power supply voltage terminal, a second transistor, a collector of which is connected to a third power supply voltage terminal, a base of which is connected to the other terminal of the second capacitor, and an emitter of which is connected to a second constant current source, and a fourth resistor connected between the emitters of the first and second transistors.

In this case, when resistances of the first, second, third, and fourth resistors are respectively represented by R1, R2, R3, and R4, and capacitances of the first and second capacitors are respectively represented by C1 and C2, if R2/R4= 2(C1*R1+C2*R3)/C1*R1 holds, the active filter serves as an all-pass filter; if R2/R4=(C1*R1+C2*R3)/C1*R1 holds, the active filter serves as a trap filter.

BRIEF DESCRIPTION OF THE DRAWINGS

FIG. 2 is a circuit diagram showing the arrangement of a gm amplifier used in the active filter shown in FIG. 1;

FIG. 3 is a circuit diagram showing the arrangement of another gm amplifier used in the active filter shown in FIG. 1;

FIG. 4 is a control block diagram showing the arrangement of an active filter according to an embodiment of the present invention; and FIG. 5 is a circuit diagram showing an example of the concrete circuit arrangement of the active filter shown in FIG. 4.

DESCRIPTION OF THE PREFERRED EMBODIMENTS

Figure 1:
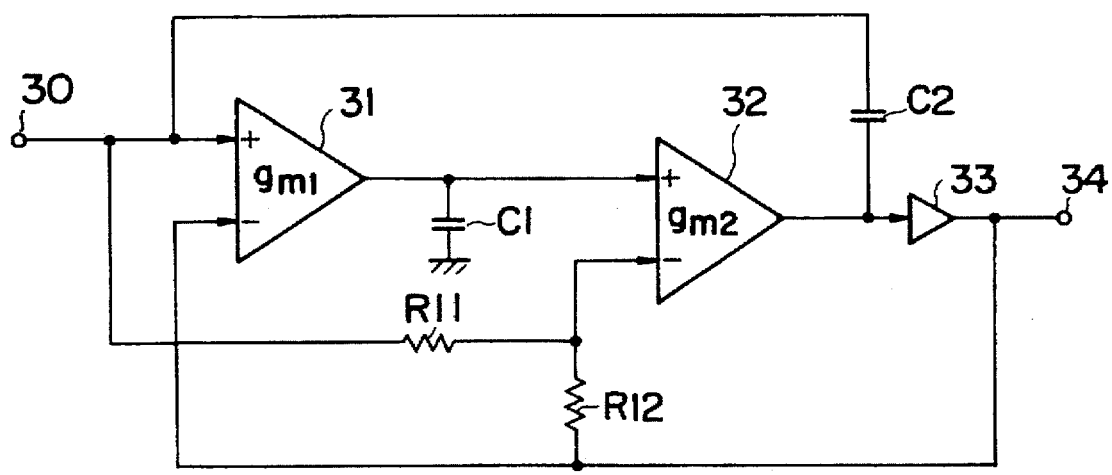
FIG. 1 is a control block diagram showing the arrangement of an active filter related to the present invention.

An embodiment of the present invention will be described hereinafter with reference to the accompanying drawings.

FIG. 4 shows the arrangement of an active filter according to this embodiment. The input terminal of a high-pass filter 11 is connected to an external input terminal 10. The output terminal of the high-pass filter 11 is connected to the input terminal of a high-pass filter 12 and the inverting input terminal of a differential amplifier 13. The output terminal of the high-pass filter 12 is connected to the non-inverting input terminal of the differential amplifier 13. Furthermore, the output terminal of the differential amplifier 13 and the external input terminal 10 are respectively connected to the input terminals of an adder 14, the output terminal of which is connected to an external output terminal 15.

In the active filter with the above arrangement, assume that the signal input to the external input terminal 10 is 1. Also, let D1(s) be the transfer function at the output terminal of the high-pass filter 11, D2(s) be the transfer function at the output terminal of the high-pass filter 12, D3(s) be the transfer function at the output terminal of the differential amplifier 13, D4(s) be the signal output from the adder 14 via the external output terminal 15, a and b be the constants of the high-pass filters 11 and 12, and G be the gain of the differential amplifier 13. In this case, these transfer functions D1(s) to D4(s) are given by:

$$D1(s) = \frac{as}{1+as} \qquad (9)$$

$$D2(s) = \frac{abs^2}{(1+as)(1+bs)} \qquad (10)$$

$$D3(s) = \frac{-asG}{(1+as)(1+bs)} \qquad (11)$$

$$\begin{aligned} D4(s) &= \frac{1+(a+b)s+abs^2}{1+(a+b)s+abs^2} + \\ &\quad \frac{-aGs}{1+(a+b)s+abs^2} \\ &= \frac{1+(a+b-aG)s+abs^2}{1+(a+b)s+abs^2} \end{aligned} \qquad (12)$$

In this case, if a+b−aG=−(a+b), the active filter serves as an all-pass filter; if a+b−aG=0, it serves as a trap filter.

FIG. 5 shows the concrete circuit arrangement of this embodiment shown in FIG. 4. The external input terminal 10 is connected to the input side of the high-pass filter 11 constituted by a constant voltage source V1, a resistor R1, and a capacitor C1, and the output side of the high-pass filter 11 is connected to one input-side terminal of the differential amplifier 13 constituted by npn transistors Q1 and Q2, resistors R3 and R4, constant current sources I11 and I12, and a constant voltage source V3. The other input-side terminal of the differential amplifier 13 is connected to the output side of the high-pass filter 12 constituted by a capacitor C2, a resistor R2, and a constant voltage source V2. The output side of the high-pass filter 12 is connected to the other input-side terminal of the differential amplifier 13. Furthermore, the external input terminal 10 is connected to the collector of the transistor Q1 of the differential amplifier 13 to constitute the adder 14. The connection node between the resistor R4 and the collector of the transistor Q1 is connected to the external output terminal 15.

In the active filter with the above arrangement shown in FIG. 5, assume that the signal input from the external input terminal 10 is 1. Also, let D1(s) be the transfer function at the node which connects one terminal of the capacitor C1 and one terminal of the resistor R1 and serves as the output terminal of the high-pass filter 11, D2(s) be the transfer function at the node which connects one terminal of the resistor R2 and one terminal of the capacitor C2 and serves as the output terminal of the high-pass filter 12, D3(s) be the transfer function at the collector terminal of the transistor Q1, which serves as the output terminal of the differential amplifier 13, and D3(s) be the transfer function output from the external output terminal 15. The transfer functions Dl(s) to D3(s) are respectively given by:

$$D1(s) = \frac{R1}{R1 + \frac{1}{j\omega C1}} \cdot 1 = \frac{j\omega C1 R1}{1 + j\omega C1 R1} \qquad (13)$$

$$D2(s) = \frac{R2}{R2 + \frac{1}{j\omega C2}} \cdot D1(s) = \qquad (14)$$

$$\frac{j\omega C1 R1}{1 + j\omega C1 R1} \cdot \frac{j\omega C2 R2}{1 + j\omega C2 R2}$$

$$D3(s) = \frac{R4}{R3}(D2(s) - D1(s)) + 1 \qquad (15)$$

$$= \frac{R4}{R3}\left(\frac{j\omega C1 R1}{1 + j\omega C1 R1} \cdot \frac{j\omega C2 R2}{1 + j\omega C2 R2} - \frac{j\omega C1 R1}{1 + j\omega C1 R1}\right) + 1$$

$$= \frac{R4}{R3} \cdot \frac{-\omega^2 C1 C2 R1 R2 - j\omega C1 R1 + \omega^2 C1 C2 R1 R2}{1 + j\omega(C1 R1 + C2 R2) - \omega^2 C1 C2 R1 R2} + 1$$

$$= \frac{1 - j\omega\left(C1R1 \cdot \frac{R4}{R3} - C1R1 - C2R2\right) - \omega^2 C1 C2 R1 R2}{1 + j\omega(C1 R1 + C2 R2) - \omega^2 C1 R1 R2}$$

When equation (16) below holds in equation (15) above and the resistors R3 and R4 satisfy equation (17) below, the active filter serves as an all-pass filter. On the other hand, when equation (18) below holds in equation (15) above and the resistors R3 and R4 satisfy equation (19) below, the active filter serves as a trap filter.

$$C1R1 \frac{R4}{R3} - C1R1 - C2R2 = C1R1 + C2R2 \qquad (16)$$

$$\frac{R4}{R3} = \frac{2(C1R1 + C2R2)}{C1R1} \qquad (17)$$

$$C1R1 \frac{R4}{R3} - C1R1 - C2R2 = 0 \qquad (18)$$

$$\frac{R4}{R3} = \frac{C1R1 + C2R2}{C1R1} \qquad (19)$$

According to this embodiment, as can be seen from FIG. 5, the active filter can be constituted by the two transistors Q1 and Q2, and the number of elements can be reduced as compared to an active filter using gm amplifiers. As a result, a size reduction and a consumption power reduction of the filter can be attained.

As described above, when an active filter is constituted using the gm amplifiers shown in FIG. 3, noise components included in an input signal may increase due to the compression effect in the transistors Q32 and Q34. However, since the present invention has no compression function, noise components can be reduced.

The above-mentioned embodiment is merely an example, and the present invention is not limited to this. For example, the circuit shown in FIG. 5 is an example, and the present invention is not limited to this arrangement. Various modifications may be made as long as the filter can constitute the control block shown in FIG. 4.

What is claimed is:

1. An active filter comprising:

a first high-pass filter for receiving an input signal, performing filter processing of the input signal, and outputting a first signal;

a second high-pass filter, an input terminal of which is connected to an output terminal of said first high-pass filter, and which receives the first signal, performs filter processing, and outputs a second signal;

a differential amplifier, one input terminal of which is connected to an output terminal of said second high-pass filter to receive the second signal, the other input terminal of which is connected to the output terminal of said first high-pass filter to receive the first signal, and which outputs a third signal obtained by multiplying a difference between the first and second signals with a gain; and an adder for receiving and adding the third signal output from said differential amplifier and the input signal, and outputting a sum signal.

2. An active filter according to claim 1, wherein when a constant of said first high-pass filter is represented by a, a constant of the second high-pass filter is represented by b, and the gain of said differential amplifier is represented by G, a+b−aG=−(a+b) holds, and said active filter serves as an all-pass filter.

3. An active filter according to claim 1, wherein when a constant of said first high-pass filter is represented by a, a constant of the second high-pass filter is represented by b, and the gain of said differential amplifier is represented by G, a+b−aG=0 holds, and said active filter serves as a trap filter.

4. An active filter comprising:

a first resistance, one terminal of which is connected to a first power supply voltage terminal;

a first capacitor, one terminal of which is connected to the other terminal of said first resistor, and the other terminal of which is connected to an external input terminal for receiving an input terminal;

a second resistor, two terminals of which are connected between the external input terminal and the external output terminal;

a first transistor, a collector of which is connected to the external output terminal, a base of which is connected the one terminal of said first capacitor, and an emitter of which is connected to a first constant current source;

a second capacitor, one terminal of which is connected to the emitter of said first transistor;

a third resistor, two terminals of which are connected between the other terminal of said second capacitor and a second power supply voltage terminal;

a second transistor, a collector of which is connected to a third power supply voltage terminal, a base of which is connected to the other terminal of said second capacitor, and an emitter of which is connected to a second constant current source; and a fourth resistor connected between the emitters of said first and second transistors.

5. An active filter according to claim 4, wherein when resistances of said first, second, third, and fourth resistors are respectively represented by R1, R2 R3, and R4, and capacitances of said first and second capacitors are respectively represented by C1 and C2, R2/R4=2(C1*R1+C2*R3)/C1*R1 holds, and said active filter serves as an all-pass filter.

6. An active filter according to claim 4, wherein when resistances of said first, second, third, and fourth resistors are respectively represented by R1, R2 R3, and R4, and capacitances of said first and second capacitors are respectively represented by C1 and C2, R2/R4 =(C1*R1+C2*R3)/C1*R1 holds, and said active filter serves as a trap filter.

* * * * *